United States Patent [19]

Schuster

[11] 4,441,039

[45] Apr. 3, 1984

[54] INPUT BUFFER CIRCUIT FOR SEMICONDUCTOR MEMORY

[75] Inventor: Stanley E. Schuster, Granite Springs, N.Y.

[73] Assignee: International Business Machines Corporation, Armonk, N.Y.

[21] Appl. No.: 323,612

[22] Filed: Nov. 20, 1981

[51] Int. Cl.³ .................. H03K 19/094; H03K 17/04; H03K 3/356; G11C 8/00

[52] U.S. Cl. .................. 307/475; 307/279; 307/362; 307/530; 365/230

[58] Field of Search .............. 307/362, 363, 449, 463, 307/475, 530, 279, 352, 353; 365/230

[56] References Cited

U.S. PATENT DOCUMENTS

| 3,795,898 | 3/1974 | Mehta et al. | 307/449 X |
|---|---|---|---|
| 4,071,783 | 1/1978 | Knepper | 307/270 |
| 4,082,966 | 4/1978 | Lou | 307/362 |
| 4,149,099 | 4/1979 | Nagami | 307/362 X |
| 4,188,588 | 2/1980 | Dingwall | 330/253 |
| 4,223,394 | 9/1980 | Pathak et al. | 307/530 X |
| 4,277,702 | 7/1981 | Hamilton et al. | 307/530 |
| 4,288,706 | 9/1981 | Reese et al. | 307/577 |
| 4,291,246 | 9/1981 | Martino, Jr. et al. | 307/475 |

FOREIGN PATENT DOCUMENTS 85141 6/1980 Japan .................. 307/475

OTHER PUBLICATIONS

Love, "FET Circuit for Receiving Weak Input Signals"; IBM Tech. Discl. Bull; vol. 21, No. 6, pp. 2590; 11/78.
Furman, "Address Buffer True/Complement Generator"; IBM Tech. Discl. Bull; vol. 18, No. 11, pp. 3597-3598; 4/76.
IBM Technical Disclosure Bulletin-Delahanty et al vol. 19, No. 7 12/76 p. 3611.
"Depletion-Mode FET load Devices Switched with Positive Signal Voltage Levels".
IBM Technical Disclosure Bulletin vol. 20, No. 9 2/78 p.3647 by Cecchi et al "Bipolar/FET Sense Latch for Storage Array".

Primary Examiner—Larry N. Anagnos
Attorney, Agent, or Firm—John J. Goodwin

[57] ABSTRACT

An address input buffer for a cross-coupled latch of the type including two switching transistors with output nodes "a" and "b". The address input buffer circuit structure includes a first depletion device having its source electrode connected to latch node "b" and the address input voltage connected to its gate, and a second depletion device having its source electrode connected to latch node "a" and to its gate so that the voltage differential across the latch is a function of the variable current difference between the two depletion devices because the gate to source voltage of one depletion device is constant and the gate to source voltage of the other depletion device is variable in accordance with the level of the address input voltage. Thus, the address input voltage is not compared to a fixed reference voltage, and no capacitive boosting of a reference and address voltage is necessary to turn on the latch. Embodiments of the address input buffer circuit for both static and dynamic random access memory applications are also disclosed.

1 Claim, 4 Drawing Figures

INPUT BUFFER CIRCUIT FOR SEMICONDUCTOR MEMORY

DESCRIPTION

1. Technical Field

This invention relates generally to the field of address input buffer circuits for semiconductor memories, and more particularly to an address input buffer circuit using current differences in depletion mode devices to generate a voltage differential for detecting address input voltage levels without a separate reference voltage or complicated clocking.

2. Background Art

Semiconductor memories, such as static and dynamic random access memories (RAMs) requires an input buffer circuit for detecting the level of the input address voltage. The input buffer circuit stores the level of the input address voltage on a latch circuit so the input can change once its level is detected.

In prior art input buffer circuits, a fixed reference voltage is provided in order to set the address voltage to the correct state. Also, it is usually necessary to capacitively boost both the reference and the address input so sufficient signal is available to turn on the latch transistors.

Representative prior patents and publications are listed hereinbelow to indicate the state of the art.

U.S. Pat. No. 4,188,588 issued Feb. 12, 1980 to Dingwall, entitled "Cicuitry with Unbalanced Long-Tailed-Pair Connections of FETs", shows a feedback amplifier using a depletion transistor and an enhancement transistor. The gate of the depletion transistor is either connected to ground or the input signal and the gate of the enhancement transistor is connected to the feedback resistor which supplies a voltage to this enhancement device so the two transistors are "balanced" and hence the single ended signal converter is balanced. Hence, the difference between the gate potentials of the two transistors is maintained at a constant value. The structure is different from the present disclosure and in addition, the voltage on the gate of the enhancement transistor is essentially a "variable" reference potential. The present disclosure has a built-in "reference potential".

U.S. Pat. No. 4,288,706 issued Sept. 8, 1981 to Reese et al, entitled "Noise Immunity in Input Buffer Circuit for Semiconductor Memory", is similar to existing address input buffers except depletion mode transistors are used in two latch devices and two input devices. This eliminates need of boosting input and reference levels to turn on these transistors. The patented circuit is structurally different from the present disclosure and also includes a reference voltage and the circuitry required to generate reference voltage. The present disclosure has built-in reference potential, simplifying address input buffer and operation.

U.S. Pat. No. 4,071,783 issued Jan. 31, 1978 to Knepper, entitled "Enhancement/Depletion Mode Field Effect Transistor Driver", shows a driver circuit that uses depletion devices and boot-strapping. It is not used to detect and latch the state of an input signal. Its function is to provide high drive capability.

U.S. Pat. No. 4,082,966 issued Apr. 4, 1978 to Lou, entitled "MOS Detector or Sensing Circuits". In this patent the relevant circuit is the mirror source follower circuit 30 of FIG. 1, which has the gate of depletion mode transistor 29 as input and matching depletion transistor 31. However, the structure of this circuit is different from the present disclosure as there is no latch and transistor 29 is operating basically as a source follower with the output voltage being made equal to the input voltage by the features of the mirror source follower circuit.

IBM Technical Disclosure Bulletin, Vol 19, No. 7, December 1976, p. 3611 by Delahanty et al shows a driver with switch load depletion devices. It is structurally different from the present invention.

IBM Technical Disclosure Bulletin, Vol. 20, No. 7, February 1978, p. 3647 by Cecchi et al shows a bipolar sense latch and again is very different from the present invention.

DISCLOSURE OF THE INVENTION

It is an object of the present invention to provide an improved address input buffer circuit including two depletion devices connected to a latch circuit for producing a differential voltage across the nodes of the latch circuit.

Another object of the present invention is to provide an improved input address buffer circuit requiring no fixed source of reference voltage to produce such differential voltage.

A further object of the present invention is to provide an improved input address buffer circuit wherein said differential voltage produced across the latch nodes is generated by the current differences in the depletion mode devices.

Still another object of the present invention is to provide an improved input address buffer circuit wherein no boosting of reference or address input voltages is required.

Another object of the present invention is to provide an improved input address buffer circuit requiring no complex clocking circuits.

A further object of the present invention is to provide an improved input address buffer for use with a static RAM.

A still further object of the present invention is to provide an improved address input buffer circuit for use with a dynamic RAM.

The foregoing and other objects, features and advantages of this invention will be apparent from the folllowiing more particular description of the invention, as illustrated in the accompanying drawings.

BRIEF DESCRIPTION OF THE DRAWINGS

The details of the invention will be described in connection with the accompanying drawings.

DESCRIPTION OF THE PREFERRED EMBODIMENT

Figure 1:
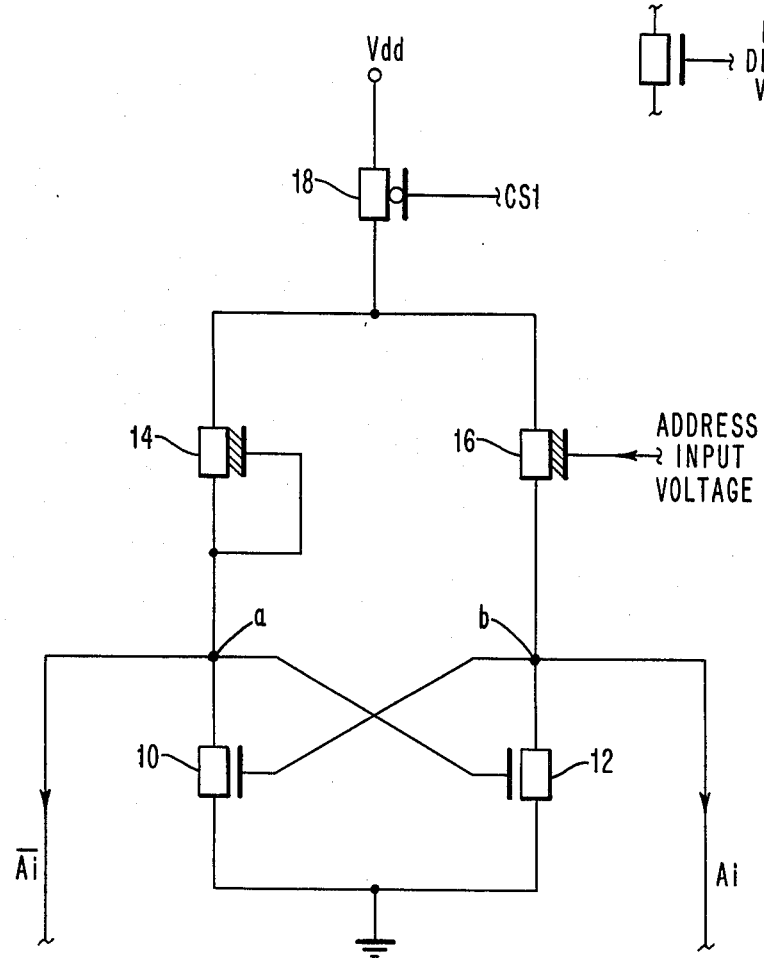
FIG. 1 is a schematic illustration of an embodiment of an address input buffer circuit according to the principles of the present invention.

Referring to FIG. 1, a schematic illustration for an embodiment of the address input buffer circuit of the present invention is shown including a cross-coupled latch comprising enhancement type transistor devices 10 and 12. The gate electrode of device 10 is connected to node "b" along with the drain of device 12 and the gate electrode of device 12 is connected to node "a" along with the drain electrode of device 10 to provide bistable operation. The source electrodes of devices 10 and 12 are connected to ground potential. The latch comprising devices 10 and 12 operates in a manner such that nodes a and b are initially at ground potential and when a voltage difference of a given magnitude appears across nodes a and b the latch will set.

When the differential voltage across nodes a and b is sufficiently high and the polarity is such that node b is positive with respect to node a device 10 turns on, which causes node a to be clamped to ground, keeping device 12 off, and an output signal Ai is obtained from node b, indicating a positive condition. Conversely, when node a is positive with respect to node b, device 12 turns on, node a rises, node b is clamped to ground and an output signal $\overline{Ai}$ is obtained from node a indicating a negative condition.

In the prior art, the differential signal across nodes a and b is produced by an address input signal that is either in a high or low state. To create the aforesaid positive and negative polarity conditions for the latch, a reference voltage is provided at a level half way in between the high and low input address signal states, such that the latch nodes see a first or a second type differential signal depending on whether the address input signal is above or below the reference level signal. The address input signal and the reference signal must usually be boosted to operate the latch devices.

In the present invention, as illustrated in FIG. 1, the latch has a first depletion type transistor device 14 having its source electrode connected to node a and a second depletion type transistor device 16 having its source connected to node b. The gate electrode of device 14 is connected to its source electrode and therefore to node a. The gate of device 16 is connected directly to the source of address input voltage. The drain electrodes of devices 14 and 16 are connected to the source electrode of transistor device 18, the drain electrode of which is connected to a source of positive voltage $V_{dd}$. A source of clock signal CSi is applied to the gate electrode of device 18.

An important feature of the circuit of FIG. 1 is the way the differential voltage across nodes a and b of the latch is generated. The voltage differential results from a variable current difference between the two depletion devices 14 and 16. The current supplied by each depletion device at any given instant is a function of the gate-to-source voltage of the device. For depletion device 14, the gate and source are common so this voltage is constant, whereas in the depletion device 16, the gate to source voltage is determined by the difference between the address input voltage and the voltage at node b.

With the address input fixed voltage applied to the gate of device 16, with device 18 off, with nodes a and b at ground potential and devices 10 and 12 off and with depletion devices 14 and 16 on, the latch operation is initiated by a clock signal CSi which turns device 18 on. Assuming the address input voltage is high, depletion device 16 will have an additional gate drive over that of depletion device 14 because of the high address input voltage, whereas the gate of device 14 is connected to its source electrode and to node a. Only when node b has reached the high address input voltage will the currents through the two depletion devices 14 and 16 be equal. However, before this happens, node b will have reached a high enough voltage, and a sufficient differential voltage will exist between nodes a and b for the latch to set. When this occurs, node a will be clamped to a low level by the high voltage on node b which will continue to rise towards a voltage level equal to the address input voltage plus the magnitude of the depletion threshold voltage of device 16. For instance, if a $-2$ volt depletion threshold voltage is used and the high address input voltage is 3 volts, node b would charge towards 5 volts.

Thus, with device 10 on, node a stays clamped low and device 12 stays off and the latch produces an output signal Ai from node b indicating a high level address.

If the address input voltage is in the low state the same initial conditions occur. This low address input voltage for example, can usually range anywhere from 0 to 0.8 volt. The current difference between the load devices is divided into three regions. In the first region, the address input voltage is greater than the voltage at node b, and more current will flow through depletion device 16 than through depletion device 14. In the second region, the address input voltage and the voltage at node b are equal, and the current difference between the depletion devices 14 and 16 goes to zero. In the third region, the address input voltage is less than the voltage at node b, and less current will flow through depletion device 16 than device 14. In attempting to set the address input buffer for a low address input, the current differences between the load devices will pass through all three of these regions. The voltage differential buildup between nodes a and b of the latch is delayed from, but will track the differences between, these load device currents until switching occurs. The final state of the address input buffer will be determined by the voltage differential that exists between nodes a and b of the latch when the magnitude of the voltage on these nodes is large enough for the latch to set. For the case where the address input buffer switches to low state, the voltage differential between nodes a and b goes through a transition from where the voltage on node b is greater than the voltage on node a to where the voltage on node a is greater than the voltage on node b. The later case is when switching takes place. If the address input buffer switches to a high state, switching occurs before this transition in the differential voltage can happen. An important advantage of the address input buffer circuit of FIG. 1 is that it operates over a wide range of input voltages, device tolerances, and power supply variations.

Figure 2:
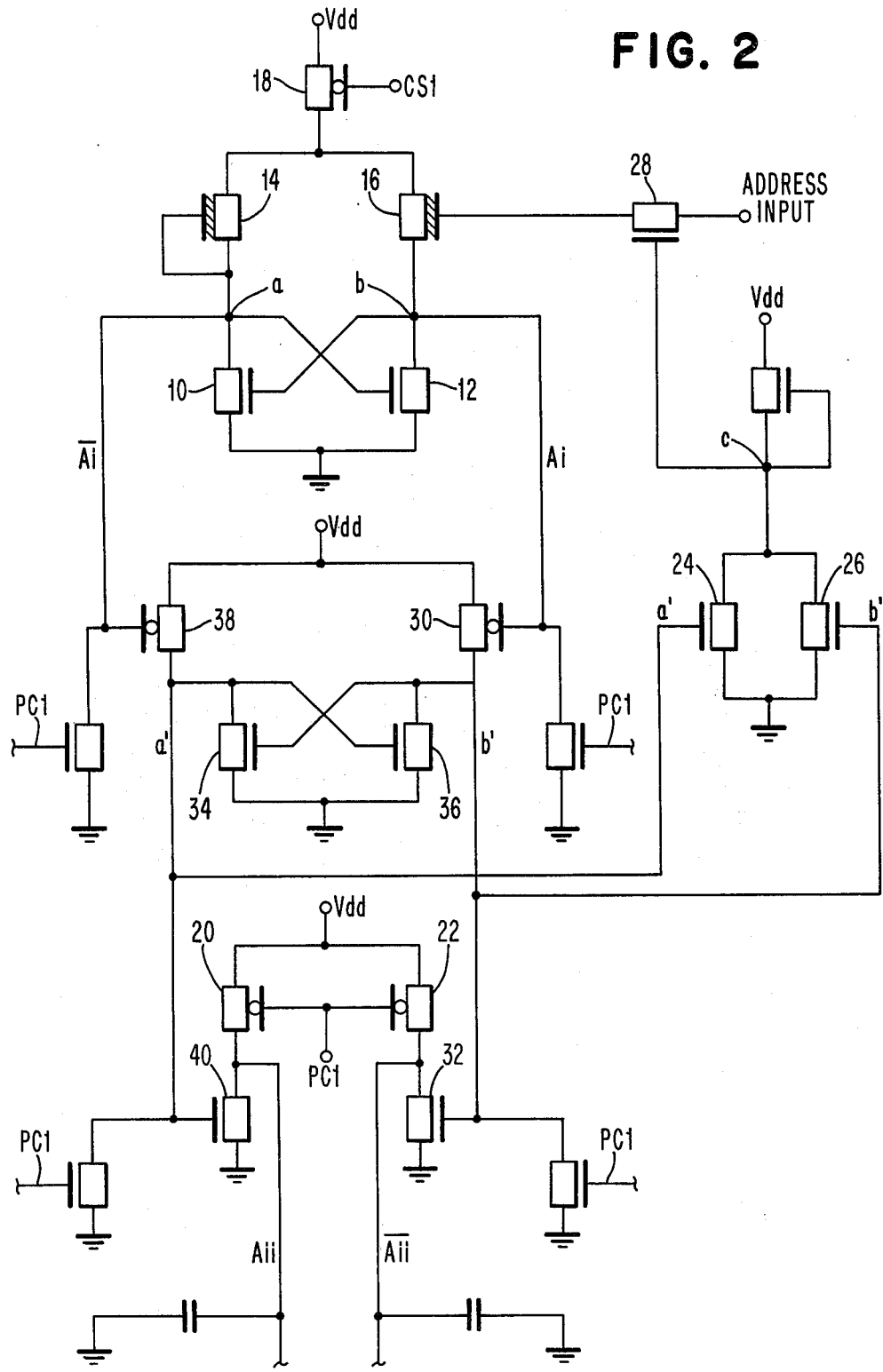
FIG. 2 shows an embodiment of the circuit of FIG. 1 utilized for static memory applications.

FIG. 2 shows an embodiment of the circuit of FIG. 1 utilized for static memory application where the address lines are precharged to a high voltage level. The schematic shows the address input buffer comprising a differential voltage generator and bistable differential voltage detector in combination with a static memory interface structure which includes a self-timed switch on the address input and circuits for pulling down the high capacitance address lines which are precharged high. In FIG. 2, PC1 is a precharge pulse. During a precharge portion of the cycle PC1 is high and the address lines Aii and $\overline{Aii}$ are charged to a high level through devices 20 and 22. Nodes a' and b', and Ai and $\overline{Ai}$ are discharged to ground. Since nodes a' and b' are low, devices 24 and 26 are off causing node C to go high turning device 28 on, thus allowing the address input to appear on the gate of depletion device 16.

Next, PC1 goes low and CS1 goes high. As CS1 goes high either Ai or $\overline{Ai}$ go high depending on whether the state of the address input voltage is low or high, as previously described.

If Ai goes high and $\overline{Ai}$ is low, Ai going high will cause device 30 to turn on and node b' will rise. Node b' rising will cause device 32 and device 26 to turn on. As device 32 turns on the internal address line $\overline{Aii}$ will discharge to a low level through device 32. It should be noted that by precharging the internal address lines Aii and $\overline{Aii}$ to a high level and then discharging one of them, enhanced performance is achieved since in FET circuits the pull down transition is faster than the pull up transition because of the additional voltage drive on the gate during the pull down transition. Thus, by precharging the high capacitance address lines Aii and $\overline{Aii}$ and then conditionally discharging one of them, a faster circuit is achieved.

As node b' rises and turns on device 26, node C will go low and turn off device 28. This maintains the state of the address input voltage on the gate electrode of depletion device 16 until the next cycle when PC1 goes high again. Thus, once the cycle begins the address input voltage can change state in anticipation of the next cycle without affecting the latch. The address input voltage only has to be at a valid state for a short period of time when CS1 is rising and the latch is being set. The circuit portion consisting of devices 34 and 36 insures that the low side, (i.e., node a') does not rise by clamping it to ground.

One skilled in the art will understand that if $\overline{Ai}$ goes high and Ai is low, device 38 will turn on instead of device 30 and node a' rather than node b' will rise. Devices 40 and 24 will turn on and line Aii will discharge to a low level through device 40.

Figure 3:
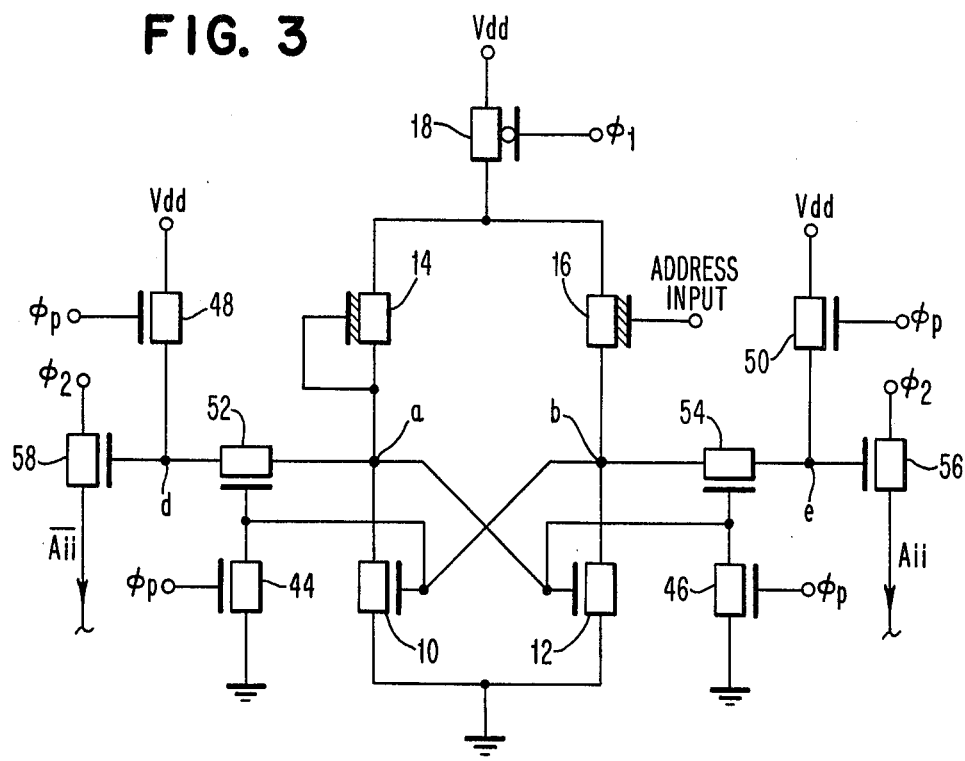
FIG. 3 shows the address input buffer circuit in an embodiment of a conventional clocked dynamic RAM.

FIG. 3 shows a conventional clocked embodiment of a dynamic RAM application of the address input buffer circuit of the present invention where the address lines Aii and $\overline{Aii}$ are initially at a low level and conditionally go high by the application of a clock signal. The operation of the circuit of FIG. 3 will be described using the clock signals illustrated in the waveform of FIG. 4.

In FIG. 3, during the precharge portion of the cycle where clock signal $\phi p$ goes high, nodes a and b are clamped to a low level through devices 44 and 46 and nodes d and e are precharged high through devices 48 and 50. Since nodes d and e are high and clock signal $\phi 2$ is low, the address lines Aii and $\overline{Aii}$ are clamped low at this time.

Figure 4:
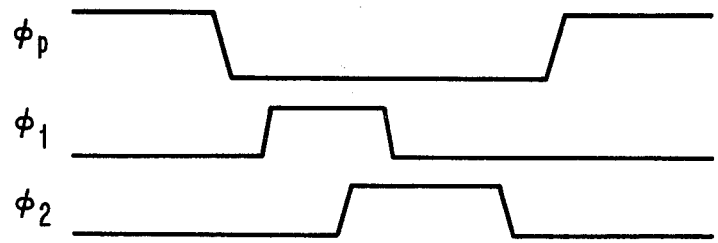
FIG. 4 is an illustration of waveforms used in the explanation of FIG. 3.

Next clock signal $\phi p$ goes low ending the precharge portion of the cycle and clock signal $\phi_1$ (previously CS1 of FIG. 1) goes high (as shown in FIG. 4), setting the state of the address input buffer circuit as a function of the address input voltage as previously described, that is, either node a or node b will go high. Although not shown, it is obvious that the same self-timed switch of FIG. 2 could be incorporated on the address input of FIG. 3.

If node b goes high, it will cause devices 52 and 10 to turn on, discharging node d through these devices. Since node a is low, devices 54 and 12 will be off and the high precharge level will be maintained at node e. Next clock signal $\phi 2$ rises as shown in FIG. 4. Since node e is high, device 56 is on and address line Aii will rise. Capacitive coupling from $\phi 2$ and Aii will cause node e to rise even higher and the full voltage level of $\phi 2$ will pass to Aii. Since node d is clamped to a low level through devices 52 and 10, device 58 is off and address line $\overline{Aii}$ will remain low as $\phi 2$ pulls up the drain of device 58.

As soon as $\phi 2$ goes high, the $\phi_1$ clock signal can go low powering down the address input buffer circuit. The voltage on address line Aii will remain high until $\phi 2$ discharges. After $\phi 2$ goes low another precharge cycle can be initiated by $\phi p$ going high again.

Having thus described my invention, what I claim as new, and desire to secure by Letters Patent is:

1. An address input buffer circuit for address input voltages comprising a differential voltage generator including first and second depletion type transistors each having a source to drain path and a gate electrode, said first depletion transistor connected between a first node and a source of supply voltage and said second depletion transistor connected between a second node and said source of supply voltage, a source of address input voltage being in one of either a high or low voltage level state, said gate electrode of said second depletion transistor connected to said source of said address input voltage, said second depletion transistor responsive to said high address voltage level state for providing a first polarity differential voltage across said first and second nodes and responsive to said low address voltage level state for providing a second polarity differential voltage across said first and second nodes, said first and second depletion type transistors each having a source, a drain and a gate electrode, said source and gate electrode of said first depletion transistor connected to said first node and said source electrode of said second depletion transistor connected to said second node, said drain electrodes of said first and second depletion devices being timely connected to said source of supply voltage, a bistable differential voltage detector including first and second enhancement type transistors each having source, drain and gate electrodes, said drain electrode of said first enhancement transistor and said gate electrode of said second enhancement transistor being connected to said first node and said drain electrode of said second enhancement transistor and said gate electrode of said first enhancement transistor being connected to said second node, and said source electrodes of said first and second enhancement type transistors being connected to reference potential, one of said first and second enhancement transistors conducting in response to said first polarity differential voltage across said first and second nodes for producing a corresponding output voltage on its drain electrode, and the other one of said first and second enhancement transistors conducting in response to said second polarity differential voltage across said first and second nodes for producing a corresponding output voltage on its drain electrode, a zero threshold transistor device connected between said source of supply voltage and said first and second depletion transistors, and a source of clock pulse signals connected to said zero threshold transistor device for turning said zero threshold transistor device on and applying said supply voltage to said first and second depletion transistors for operating said differential voltage generator, a static memory interface structure connected to said source of supply voltage and to first and second nodes of said differential voltage generator and said bistable differential voltage detector, said static interface memory structure having first and second output address lines, a switching device having a first and a second side, said switching device being connected on one side to said source of address input signals and said gate of said second depletion transistor and the other side of said switching device being connected to said static interface memory structure, a source of precharge pulse signal connected to said static interface memory structure, said precharge pulse signal from said source functioning to raise said output address lines of said static interface memory structure to a high level and actuating said switching device, causing said address input voltage to be applied to said gate electrode of said second depletion transistor, and said static interface memory structure being responsive to said corresponding output voltages from said bistable differential voltage detector on said first and second nodes for discharging one or the other corresponding precharged first and second output address lines to a low level, the other one of said first and second output address lines remaining at said high level, and wherein said address input signal is maintained on said gate of said second depletion device of said differential voltage detector until the occurrence of a subsequent precharge pulse signal.

* * * * *